United States Patent
Kothandaraman et al.

(10) Patent No.: US 6,432,760 B1
(45) Date of Patent: Aug. 13, 2002

(54) METHOD AND STRUCTURE TO REDUCE THE DAMAGE ASSOCIATED WITH PROGRAMMING ELECTRICAL FUSES

(75) Inventors: Chandrasekharan Kothandaraman, Wappingers Falls; Michael Stetter, Fishkill; Sundar K. Iyer, Beacon, all of NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/751,475

(22) Filed: Dec. 28, 2000

(51) Int. Cl.[7] .................. H01L 21/8238; H01L 21/331
(52) U.S. Cl. .................. 438/215; 438/132; 438/281; 438/333; 438/467; 438/601; 257/529
(58) Field of Search ................... 438/132, 215, 438/281, 333, 467, 601; 257/173, 529, 665, 910, 209, 216

(56) References Cited

U.S. PATENT DOCUMENTS

| 5,895,262 A | * | 4/1999 | Becker et al. | ............... 438/132 |
|---|---|---|---|---|
| 5,970,346 A | * | 10/1999 | Liaw | ............... 148/DIG. 55 |
| 6,124,165 A | * | 9/2000 | Lien | ............... 438/132 |
| 6,271,574 B1 | * | 8/2001 | Delpech et al. | ............... 257/529 |
| 6,300,252 B1 | * | 10/2001 | Ying et al. | ............... 216/67 |
| 6,372,652 B1 | * | 4/2002 | Verma et al. | ............... 438/706 |

* cited by examiner

Primary Examiner—Tom Thomas
Assistant Examiner—Donghee Kang
(74) Attorney, Agent, or Firm—Stanton Braden

(57) ABSTRACT

An improved fuse structure in an integrated circuit (IC) structure is made by forming a gate stack comprised of layers of polysilicon and a silicide. Subsequent to the formation of the silicide layer, an etch stop silicon nitride layer is deposited over the silicide layer. The silicon nitride layer is patterned to expose the silicide layer. A soft passivation layer is deposited over the exposed silicide layer. The soft passivation layer has a low thermal conductivity which confines energy in the silicide layer, minimizing the current needed to program the fuse. The inherent ductility of the soft passivation layer prevents the generation of cracks in the surrounding layers.

8 Claims, 3 Drawing Sheets

METHOD AND STRUCTURE TO REDUCE THE DAMAGE ASSOCIATED WITH PROGRAMMING ELECTRICAL FUSES

DESCRIPTION

BACKGROUND OF THE INVENTION

1. Field of the Invention

The present invention generally relates to programming electrical fuses in integrated circuit (IC) devices and, more particularly, to an improved method and structure to reduce the damage associated with programming electrical fuses.

2. Background Description

Fuses are fabricated on various IC devices, such as memory arrays, to improve the yield during manufacturing. They are also used in some devices, such as field programmable arrays (FPGAs), to allow customization of the IC device for a particular application. Commonly, fuse structures are realized by patterning a gate stack (polysilicon and cobalt/tungsten silicide) to the appropriate dimensions. An etch-stop silicon nitride layer is deposited over the silicide as part of the fabrication process. The fusing process passes an electrical current through the fuse element to melt the fuse link by the resistive heating of the element. The location of the breakage is dependent on the defect structure in the fuse link.

Significant energy is needed to blow the fuse manufactured according to the current process. This leads to the generation of cracks in the surrounding layers. To prevent damage to other structures, the fuses are often laid out in a guarded area.

SUMMARY OF THE INVENTION

It is therefore an object of the present invention to provide an improved fuse structure which does away with the need to isolate the fuse structure to prevent damage to other structures.

It is another object of the invention to provide a fuse structure which exhibits improved reliability, efficiency, yield and packing density.

According to the invention, there is provided a new fuse structure which replaces the brittle and relatively inert nitride and silicon dioxide layer in current fuses with a soft passivation layer. The inherent ductility present in the soft passivation layer prevents the generation of cracks. In addition, this reduces pressure on the silicide link, allowing it to melt easily, lowering the current required to blow the fuse.

Specifically, during the manufacture of the fuse structure, the brittle and relatively inert silicon nitride and silicon dioxide layer is removed and a soft passivation layer is applied. A preferred material for the soft passivation layer is known in the art as "SILK" for Silicon Low K. Other possible materials could be various "spin-on" dielectrics such as fluorosilicate glass or siloxane containing polymers.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
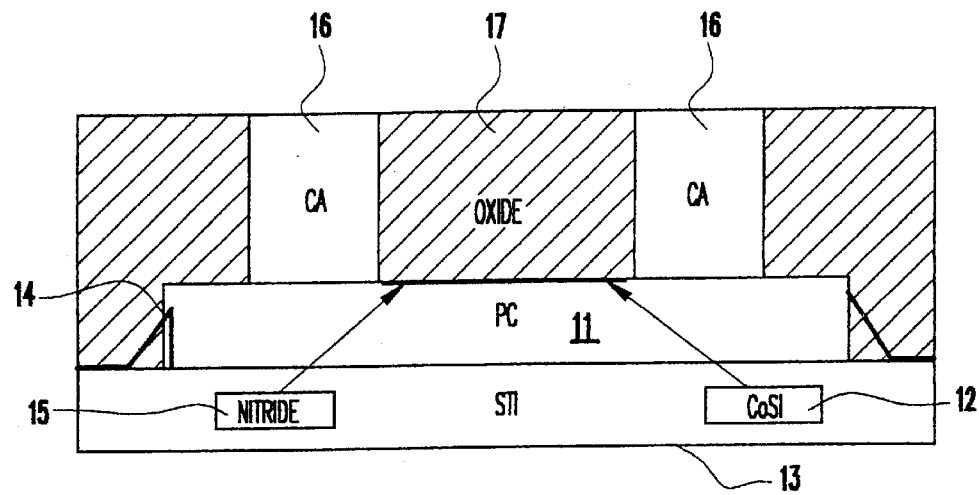
FIG. 1 is a cross-sectional view of the current fuse structure.

Referring now to the drawings, and more particularly to FIG. 1, there is shown a cross-section view of the current fuse structure. The current fuses are realized by patterning a gate stack (polysilicon 11 and cobalt/tungsten silicide 12) on a silicon substrate 13 to the appropriate dimensions. After passivation 14 has been applied to the patterned sidewalls of the polysilicon 11 and silicide 12, an etch-stop nitride 15 is deposited over the silicide as part of the standard process. Metal contacts 16, typically tungsten, are formed within holes formed in an overlying oxide layer 17.

The fusing process melts the fuse link by the resistive heating of the fuse element comprising the polysilicon 11 and silicide 12. Significant energy is needed to blow the fuse, as a portion of the energy is conducted away into other adjacent layers. This leads to the generation of cracks in the surrounding layers. These cracks could propagate under the cyclic stresses present in the chip operating environment leading to poor reliability in the field.

Figure 2:
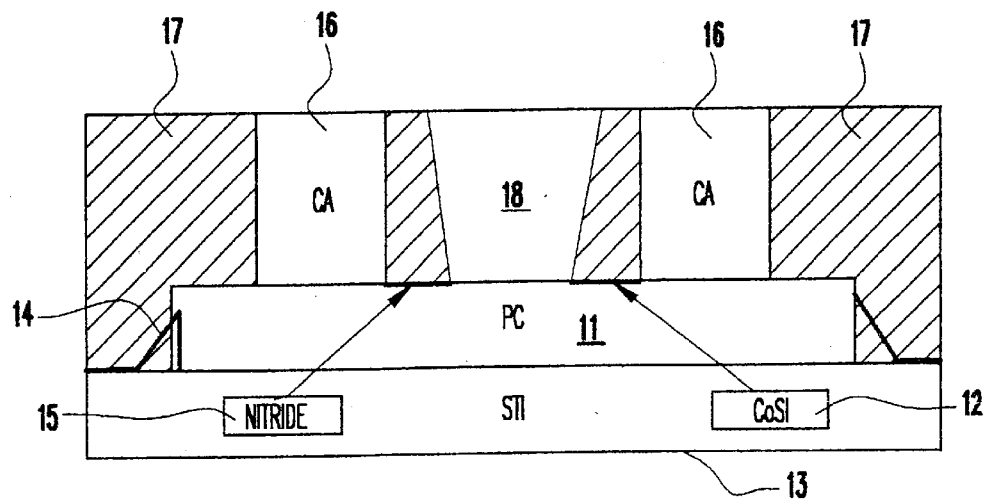
FIG. 2 is a cross-sectional view of the new fuse structure according to the invention.

FIG. 2 shows the new fuse structure according to the invention. The process of manufacture is similar to that of the current process except that in the new structure, a lithographic patterning step and an etch is performed to open the fuse area, removing the oxide 17 above the fuse. The brittle and relatively inert silicon nitride layer 15 directly over the fuse is also removed in the etch. Then, a soft passivation layer 18 is applied. A suitable material for the soft passivation layer is "SILK" (Silicon Low K).

Figure 3A:
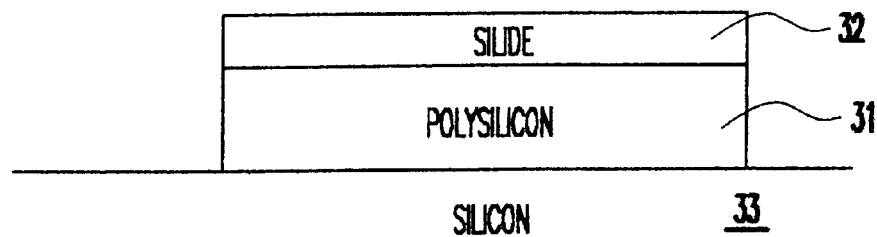
FIGS. 3A to 3E are cross-sectional view illustrating the process of manufacturing the fuse structure of FIG. 2.
Figure 3B:
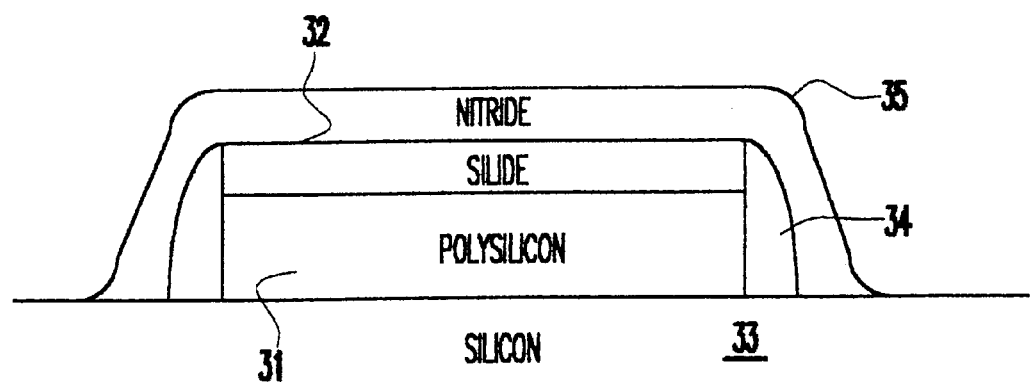
Figure 3C:
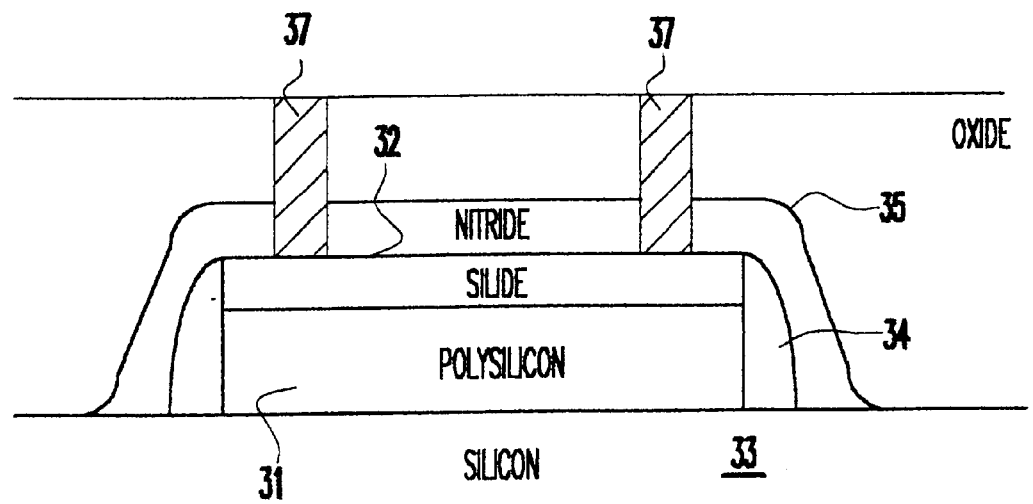

FIG. 3A shows the results of the first steps in the process to manufacture the structures shown in FIGS. 1 and 2. A polysilicon layer 31 and an overlying silicide layer 32 are deposited on a silicon substrate 33. The polysilicon layer 31 and the silicide layer 32 are patterned to form the desired shape and size of the fuse. Then, in FIG. 3B, sidewall passivation 34 is applied to the patterned polysilicon and silicide layers, and after passivation of the sidewalls, a layer of silicon nitride 35 is applied over the structure. In the next steps shown in FIG. 3C, an oxide layer 36 is applied over the structure, and then contact holes are etched through the oxide layer 36 and the underlying nitride layer 35 to the silicide layer 32. These contact holes are then filled with a metal, such as tungsten, to provide the electrical contacts 37.

Figure 3D:
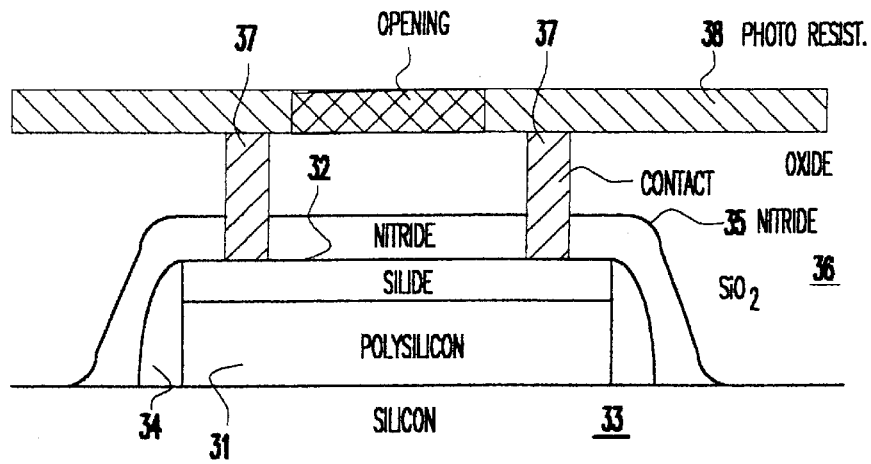
Figure 3E:
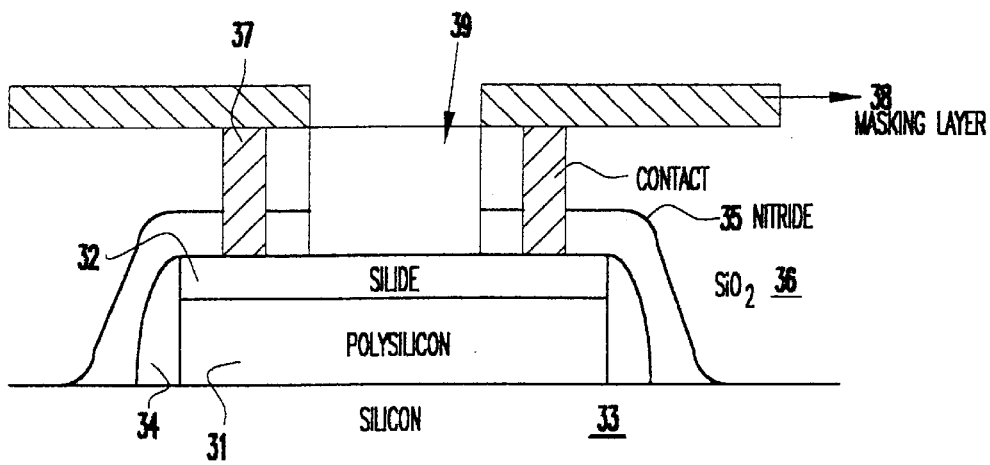

The process to this point is conventional and yields the structure shown in FIG. 1. The invention takes the process further. Specifically, in FIG. 3D, a photoresist 38 is applied over the top surface of the structure. This photoresist is patterned over the fuse area. The oxide 36 and the nitride 35 are etched to expose the underlying silicide 32. Finally, in FIG. 3E, the photoresist masking layer is removed and the opening is filled with a "soft-passivation" material 39. The preferred material is "SILK" for Silicon Low K. Other possible materials could be various "spin-on" dielectrics such as fluorosilicate glass or silocane containing polymers. The application of this material is preferably done by spinning on the low k dielectric. The material is cured and planarized to complete the process.

The inherent ductility present in the soft passivation layer 39, as opposed to the brittle and inert silicon nitride and silicon dioxide, prevents the generation of cracks. Further, this reduces the pressure on the silicide link, allowing it to melt easily. Specifically, in the case of SILK, its smaller thermal conductivity confines the energy more efficiently, resulting in a decrease in the current needed to program the fuse.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of making an improved fuse structure in an integrated circuit (IC) formed in a silicon substrate comprising the steps of:

forming a gate stack comprised of layers of polysilicon and a silicide;

subsequent to the formation of the silicide layer, depositing an etch stop silicon nitride layer over the silicide layer;

covering the nitride layer with an oxide layer;

depositing and patterning a photoresist layer to define an opening over the oxide layer;

etching the oxide layer and the silicon nitride layer to expose the silicide layer of the gate stack; and depositing a soft passivation layer over the exposed silicide layer, the soft passivation layer having a low thermal conductivity which confines energy in the silicide layer.

2. The method of making an improved fuse structure recited in claim 1, further comprising the step of planarizing the soft passivation layer.

3. The method of making an improved fuse structure recited in claim 1, wherein the step of forming the gate stack comprises the steps of:

depositing a layer of polysilicon over a silicon substrate;

depositing a layer of silicide over the layer of polysilicon; and patterning the polysilicon and silicide to a desired dimension and shape.

4. The method of making an improved fuse structure recited in claim 3, further comprising the step of applying passivation to sidewalls of the patterned polysilicon and silicide.

5. The method of making an improved fuse structure recited in claim 4, further comprising the step of planarizing the soft passivation layer.

6. The method of making an improved fuse structure recited in claim 1, wherein the soft passivation layer is "SILK" (Silicon Low K).

7. The method of making an improved fuse structure recited in claim 1, wherein the soft passivation layer is a "spin-on" dielectric.

8. The method of making an improved fuse structure recited in claim 7, wherein the soft passivation layer is selected from the group consisting of "SILK" (Silicon Low K), fluorosilicate glass, and siloxane containing polymers.

\* \* \* \* \*